(12) United States Patent
Hu et al.

(10) Patent No.: US 11,251,393 B2
(45) Date of Patent: Feb. 15, 2022

(54) FLEXIBLE DISPLAY MODULE, FLEXIBLE DISPLAY DEVICE AND METHOD FOR PREPARING THE FLEXIBLE DISPLAY MODULE

(71) Applicant: Yungu (Gu'an) Technology Co., Ltd., Langfang (CN)

(72) Inventors: Kun Hu, Langfang (CN); Hao Feng, Langfang (CN); Pengle Dang, Langfang (CN); Bo Yuan, Langfang (CN); Li Lin, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 0 days.

(21) Appl. No.: 16/530,281

(22) Filed: Aug. 2, 2019

(65) Prior Publication Data
US 2019/0355925 A1    Nov. 21, 2019

Related U.S. Application Data

(63) Continuation of application No. PCT/CN2018/089566, filed on Jun. 1, 2018.

(30) Foreign Application Priority Data

Oct. 31, 2017    (CN) .......................... 201711045921.X (51) Int. Cl.
*H01L 51/52* (2006.01)
*G06F 3/041* (2006.01)
(Continued)

(52) U.S. Cl.
CPC .......... *H01L 51/5237* (2013.01); *G06F 3/041* (2013.01); *H01L 51/0097* (2013.01);
(Continued)

(58) Field of Classification Search
CPC ............ H01L 51/5237; H01L 51/0097; H01L 27/3244; H01L 2251/5338; H01L 51/5281;
(Continued)

(56) References Cited

U.S. PATENT DOCUMENTS

| 6,356,259 | B1 * | 3/2002 | Maeda | .............. B32B 17/10018 |
|  |  |  |  | 156/99 |
| 2009/0015747 | A1 * | 1/2009 | Nishizawa | ........ G02F 1/133308 |
|  |  |  |  | 349/58 |

(Continued)

FOREIGN PATENT DOCUMENTS

| CN | 103985321 A | 8/2014 |
| CN | 104779266 A | 7/2015 |

(Continued)

OTHER PUBLICATIONS

PCT Written opinion dated Aug. 21, 2018 in International Application No. PCT/CN2018/089566.
(Continued)

*Primary Examiner* — Anthony J Frost
(74) *Attorney, Agent, or Firm* — Rimon PC (57) ABSTRACT

A flexible display module according to the present application includes a number of module material layers superposed; and at least one strain isolation layer disposed between the two adjacent the module material layers. The strain isolation layer includes a chamber and an elastic material layer surrounding an outer periphery of the chamber.

14 Claims, 10 Drawing Sheets

(51) Int. Cl.
*H01L 51/00* (2006.01)
*H01L 27/32* (2006.01)

(52) U.S. Cl.
CPC ...... *C09K 2323/00* (2020.08); *C09K 2323/03* (2020.08); *C09K 2323/05* (2020.08); *G06F 2203/04102* (2013.01); *G06F 2203/04103* (2013.01); *H01L 27/3244* (2013.01); *H01L 2251/5338* (2013.01)

(58) Field of Classification Search
CPC ................ H01L 27/323; G06F 3/041; G06F 2203/04102; G06F 2203/04103; C09K 2323/05; C09K 2323/03; C09K 2323/00; Y02E 10/549; B32B 27/00; G09F 9/30
See application file for complete search history.

(56) References Cited

U.S. PATENT DOCUMENTS

| | | | | |
|---|---|---|---|---|
| 2014/0035935 | A1* | 2/2014 | Shenoy | H01L 23/5389 345/501 |
| 2015/0015832 | A1* | 1/2015 | Nagura | C08K 3/36 349/96 |
| 2015/0060777 | A1* | 3/2015 | Premutico | H01L 51/0097 257/40 |
| 2015/0102298 | A1* | 4/2015 | Namkung | H01L 51/0097 257/40 |
| 2016/0154462 | A1* | 6/2016 | Haga | G06F 3/047 345/174 |
| 2016/0157343 | A1* | 6/2016 | Abe | H05K 1/0393 361/749 |

FOREIGN PATENT DOCUMENTS

| | | |
|---|---|---|
| CN | 204808776 U | 11/2015 |
| CN | 105283311 A | 1/2016 |
| CN | 105975135 A | 9/2016 |
| CN | 106558279 A | 4/2017 |
| CN | 106710449 A | 5/2017 |
| CN | 106910430 A | 6/2017 |
| CN | 107230429 A | 10/2017 |
| CN | 107633775 A | 1/2018 |
| JP | 2012139963 A | 7/2012 |
| TW | M259183 A | 3/2005 |
| TW | 201535335 A | 9/2015 |

OTHER PUBLICATIONS

Chinese Second Office Action for CN Application No. 201711045921.X dated Sep. 12, 2019.
Chinese Third Office Action for CN Application No. 201711045921.X dated Feb. 6, 2020.
Taiwan First Office Action for Application No. 107121859 dated Feb. 22, 2019.
PCT International Search Report dated Aug. 21, 2018 in International Application No. PCT/CN2018/089566.
Chinese First Office Action for CN Application No. 201711045921.X dated Mar. 5, 2019.

* cited by examiner

FLEXIBLE DISPLAY MODULE, FLEXIBLE DISPLAY DEVICE AND METHOD FOR PREPARING THE FLEXIBLE DISPLAY MODULE

CROSS-REFERENCE TO RELATED APPLICATIONS

This application is a continuation of International Application No. PCT/CN2018/089566 filed on Jun. 1, 2018, which claims priority to Chinese patent application No. 201711045921.X filed on Oct. 31, 2017. Both applications are incorporated herein in their entireties by reference.

TECHNICAL FIELD

The present application relates to the field of display module technologies, and more particularly to a flexible display module, a flexible display device and a method for preparing the flexible display module.

BACKGROUND

A flexible display module is a display module that can be bendable and deformable, and display modes of the flexible display module include a plurality of types such as an Organic Light Emitting Diode (OLED), an Electrophoretic Display (EPD), a Liquid Crystal Display Device (LCD) and the like. The flexible display module that is bendable and deformable may bring a disruptive usage experience for users. However, when the flexible display module is bent and deformed, components of the flexible display module, such as a Thin Film Transistor (TFT), a conductive wiring and the like, may be ruptured due to stress concentration, and the flexible display module may also be delaminated due to uneven force, thereby display failure of the flexible display module is caused. On the other hand, laminate structure of a flexible module is complicated, and each bonding process is prone to failure, resulting in that a good rate of the flexible display module is decreased.

SUMMARY

In view of this, embodiments of the present application provide a flexible display module, a flexible display device and a method of preparing the flexible display module, which solve the problem of display failure resulted by delamination or fracture of various functional layers inside a module when the existing flexible display module is bent and deformed.

A flexible display module according to an embodiment of the present application includes a plurality of module material layers superposed; and at least one strain isolation layer disposed between two adjacent module material layers. The strain isolation layer includes a chamber and an elastic material layer surrounding an outer periphery of the chamber.

In an embodiment, the plurality of the module material layers includes a flexible display screen body, a touch layer, and a polarizer layer that are sequentially superposed.

In an embodiment, the strain isolation layer is disposed between the flexible display screen body and the touch layer, and/or disposed between the touch layer and the polarizer layer.

In an embodiment, the chamber is in a vacuum state, or the chamber is filled with one or more of gas and silicone oil.

In an embodiment, a top surface of the chamber is a bottom surface of one module material layer of the two adjacent module material layers, and a bottom surface of the chamber is a top surface of another module material layer of the two adjacent module material layers.

In an embodiment, at least one of the module material layers includes a flexible glass substrate, and the flexible display screen body is disposed on a first surface of the flexible glass substrate.

In an embodiment, an elastic modulus of the flexible glass substrate is not lower than 80 GPa, and/or, a thickness of the flexible glass substrate is 25 μm to 100 μm.

In an embodiment, the flexible display module further includes a trace region disposed on a second surface of the flexible glass substrate and electrically connected to the flexible display screen body, and the first surface and the second surface of the flexible glass substrate are opposite surfaces.

In an embodiment, the flexible glass substrate includes a via hole through which a circuit trace in the trace region electrically connects the flexible display screen body with an external circuit.

In an embodiment, an elastic modulus of the elastic material layer is lower than that of the two adjacent module material layers.

A flexible display device includes a flexible display module and a frame with a preset curved surface shape, and the flexible display module is placed in the frame, and perimeter of the frame is less than that of the flexible display module.

In an embodiment, an inner surface of the frame includes an annular concave groove, and the frame is bonded to a periphery of the flexible display module in a frame-bonding manner.

In an embodiment, a depth of the annular concave groove is 3 to 5 mm.

In an embodiment, a cross-sectional shape of the annular concave groove is any one of an arc, a trapezoidal shape, and a U-shaped.

A method of preparing a flexible display module includes: preparing or providing separately a plurality of module material layers; and superposing the plurality of the module material layers and disposing a strain isolation layer between at least one group of two adjacent module material layers. The strain isolation layer includes a chamber and an elastic material layer surrounding an outer periphery of the chamber.

In an embodiment, the plurality of the module material layers include a flexible display screen body, a polarizer layer and a touch layer, and the preparing or providing separately a plurality of module material layers include: providing a first flexible glass substrate on which the flexible display screen body is prepared; and/or, providing a second flexible glass substrate on which the polarizer layer is prepared; and/or, providing a third flexible glass substrate on which the touch layer is prepared.

In an embodiment, the superposing the plurality of the module material layers and disposing a strain isolation layer between at least one group of two adjacent module material layers includes: superposing sequentially a flexible display screen body, a touch layer and a polarizer layer. The strain isolation layer is disposed between the flexible display screen body and the touch layer, and/or disposed between the touch layer and the polarizer layer.

In an embodiment, the superposing the plurality of the module material layers and disposing a strain isolation layer between at least one group of two adjacent module material layers further includes: preparing the elastic material layer with hollow structure on a top surface of one module material layer of two adjacent the module material layers; and bonding another module material layer of the two adjacent module material layers on a surface of the elastic material layer.

Embodiments of the present application provide a flexible display module. A strain isolation layer is disposed between module material layers. Since a chamber of the strain isolation layer can isolate effectively a strain of a plurality of module material layers, transmission of the strain between the plurality of the module material layers can be prevented effectively when a bending deformation is occurred, and the strain of each module material layer may be reduced, thereby bendable resistance of the flexible display module is significantly improved, and reliability of a product is improved.

DETAILED DESCRIPTION

Technical solutions in embodiments of the present application are described clearly and completely as follows with reference to accompanying drawings in the embodiments of the present application. Obviously, described embodiments are only a part of the embodiments of the present application and are not all of the embodiments. All other embodiments obtained by those skilled in the art based on the embodiments of the present application without creative efforts belong to a protective scope of the present application.

Figure 1:
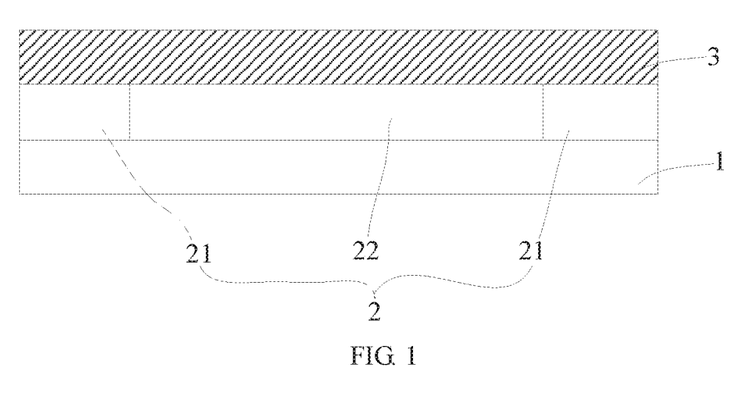
FIG. 1 is a schematic structural diagram of a flexible display module according to an embodiment of the present application.

FIG. 1 is a schematic structural diagram of a flexible display module according to an embodiment of the present application.

As shown in FIG. 1, the flexible display module according to the embodiment of the present application includes a first module material layer 1 and a second module material layer 3 superposed on the first module material layer 1; and at least one strain isolation layer 2 disposed between the first module material layer 1 and the second module material layer 3. The strain isolation layer 2 includes a chamber 22 and an elastic material layer 21 surrounding an outer periphery of the chamber 22.

A module material layer is a functional unit constituting the flexible display module, and each module material layer may include a plurality of functional layers. For example, the module material layer may include a flexible display screen body, a touch layer a polarizer layer and the like. In order to distinguish different module material layers, determiners such as first and second are introduced in the embodiment of the present application, for example, the first module material layer 1 and the second module material layer 3 and the like.

In the flexible display module according to the embodiment of the present application, the strain isolation layer 2 is disposed between the first module material layer 1 and the second module material layer 3. Since a strain of the first module material layer 1 and that of the second module material layer 3 may be effectively isolated by the strain isolation layer 2, transmission of a strain between the first module material layer 1 and the second module material layer 3 may be effectively prevented when a bending deformation is occurred, and the strain of the first module material layer 1 and that of the second module material layer 3 are reduced, so that bendable resistance of the flexible display module is significantly improved, and reliability of a product is improved.

However, it should be understood that the flexible display module according to the embodiment of the present application is not limited to include only the first module material layer 1 and the second module material layer 3 shown in FIG. 1, and may also include more module material layers. The strain isolation layer 2 may be disposed between all of two adjacent the module material layers. The number of the module material layers and the strain isolation layer 2 being disposed between which adjacent the module material layers are not specifically limited in the embodiments of the present application.

In an embodiment, the chamber 22 may be filled with gas and may also be in a vacuum state, which may play a role of isolating the strain. However, the gas is filled in the chamber 22, which can balance the internal and external pressure of the chamber 22. In one embodiment, the gas may be any one or any combination of air and inert gas. Resources of the air are abundant and collection of the air is convenient, so filling the air in the chamber 22 can reduce a production cost of the flexible display module. The gas may also be the inert gas. Since chemical performance of the inert gas is stable, and it is difficult for the inert gas to react with a substance in contact with the inert gas, a usage life of the flexible display module can be improved by using the inert gas in the chamber 22. However, the kind of the gas in the chamber 22 is not specifically limited in the embodiments of the present application.

In an embodiment, the chamber 22 may also be filled with fillers such as silicone oil or other fillers, the fillers may coexist with the gas and may also not coexist with the gas, and a type of fillers in the chamber 22 is not specifically limited in the embodiments of the present application.

Figure 2:
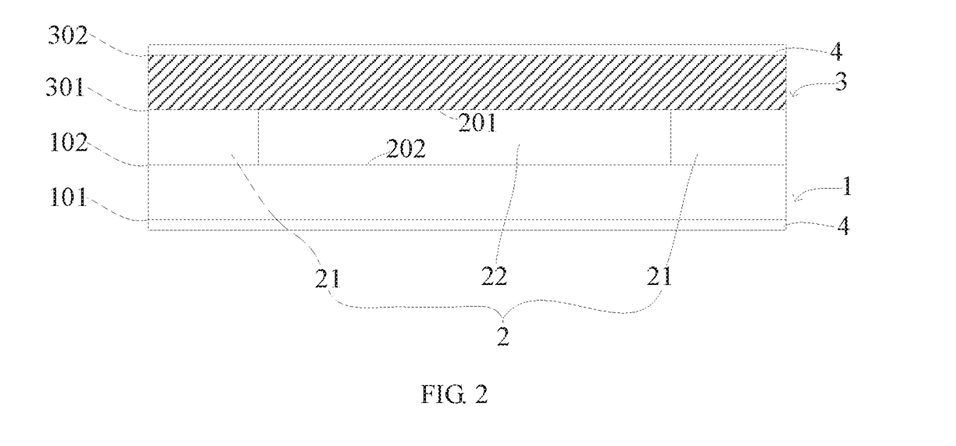
FIG. 2 is a schematic structural diagram of a flexible display module according to another embodiment of the present application.

FIG. 2 is a schematic structural diagram of a flexible display module according to another embodiment of the present application.

Referring to FIG. 2, a top surface 201 of a chamber 22 may be part of a bottom surface 301 of a second module material layer 3, and a bottom surface 202 of the chamber 22 may be part of a top surface 102 of a first module material layer 1. Thus, the chamber 22 does not have to be prepared separately. After the first module material layer 1 and the second module material layer 3 are bonded with an elastic material layer 21, the chamber 22 may be formed, thereby a preparation process is simplified and a preparation cost is reduced. It should be understood that the chamber 22 may also be a cavity disposed inside the elastic material layer 21 and does not extend to the top surface 102 of the first module material layer 1 or the bottom surface 301 of the second module material layer 3, a shape of the chamber 22 is not specifically limited in the embodiments of the present application.

Referring to FIG. 2, in an embodiment, the first module material layer 1 includes a first flexible glass substrate 41 disposed on the top surface 102 or a bottom surface 101. The second module material layer 3 includes the second flexible glass substrate 42 disposed on a top surface 302 or a bottom surface 301. In this way, the first module material layer 1 and the second module material layer 3 may be prepared separately on the first flexible glass substrate 41 and the second flexible glass substrate 42, and then the first module material layer 1, the second module material layer 3 and the elastic material layer 21 are bonded.

In an embodiment, the first flexible glass substrate 41 or the second flexible glass substrate 42 may be an ultra-thin flexible glass having a certain elastic modulus, for example, an elastic modulus of the ultra-thin flexible glass may be not less than 80 GPa, which can ensure that the flexible display module still has certain rigidity and the flexible display module is not very soft.

Researches show that a bending deformation of glass may be increased as a thickness of the glass decreases. When the glass is thin enough, bendable resistance of the glass is reflected, that is, the glass may be bent without breaking. Ultra-thin flexible glass has hardness, transparency, heat resistance, electrical insulation, air-impermeability, and relatively stable mechanical and chemical performance in oxidation and light environments of the glass, and is also flexible and light in weight, so that a thickness of the flexible display module may be reduced by using the first flexible glass substrate 41 or the second flexible glass substrate 42. In the embodiment of the present application, a thickness of the first flexible glass substrate 41 and the second flexible glass substrate 42 may be 25 μm to 100 μm. However, a specific thickness of the first flexible glass substrate 41 and the second flexible glass substrate 42 is not limited in the embodiments of the present application.

In an embodiment, the elastic material layer 21 may be composed of a material having a low elastic modulus. An elastic modulus of the elastic material layer 21 may be several KPa to several dozen KPa, which is much less than that of the first module material layer 1 and the second module material layer 3 (e.g., an elastic modulus of a module material layer in the flexible display module is several dozen GPa to hundreds of GPa). Therefore, an effective passage for slip between the first module material layer 1 and the second module material layer 3 is provided by using deformability of the elastic material layer 21 during a deformation process of the elastic material layer 21, especially when the elastic material layer 21 is subjected to a shear stress.

In an embodiment, a material of the elastic material layer 21 may be silicone rubber, but the material of the elastic material layer 21 is not limited in the present application, and the material of the elastic material layer 21 may also be other materials having a low elastic modulus.

Figure 3A:
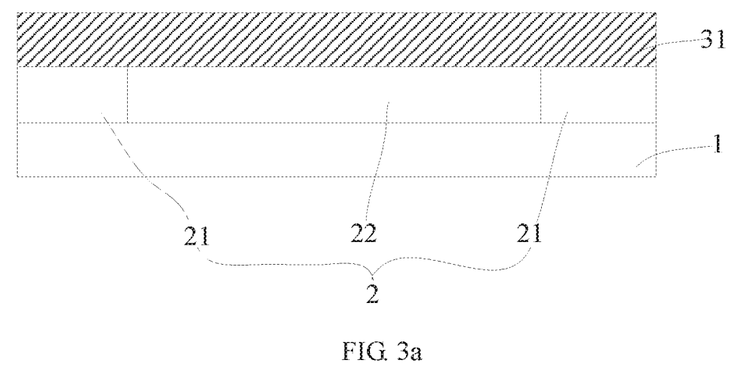
FIG. 3a is a schematic structural diagram of a flexible display module according to another embodiment of the present application.
Figure 3B:
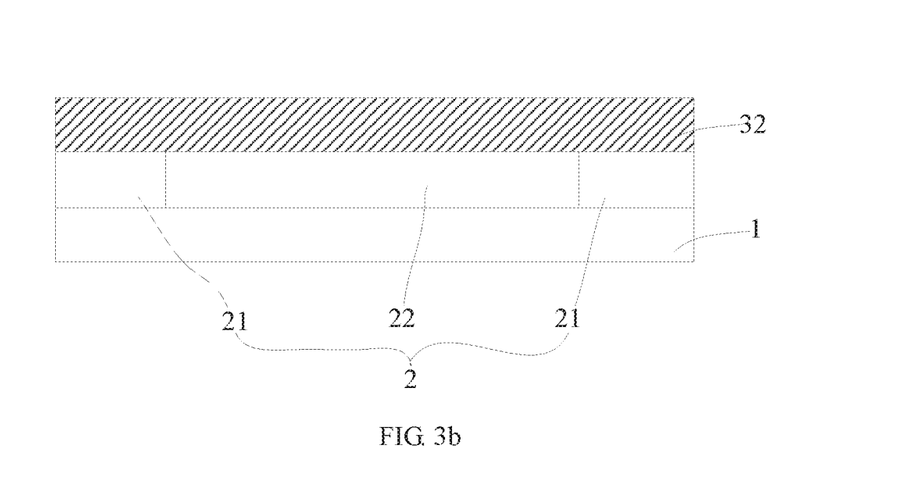
FIG. 3b is a schematic structural diagram of a flexible display module according to another embodiment of the present application.
Figure 3C:
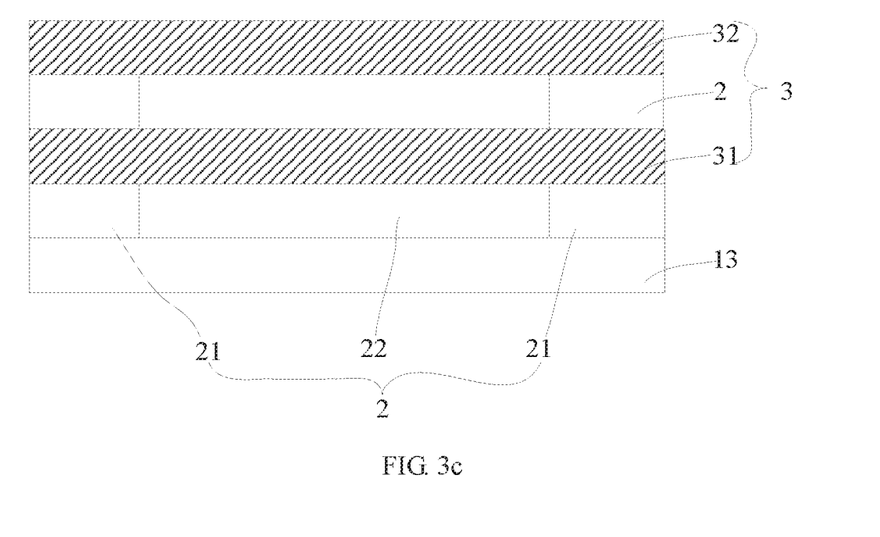
FIG. 3c is a schematic structural diagram of a flexible display module according to another embodiment of the present application.
Figure 3D:
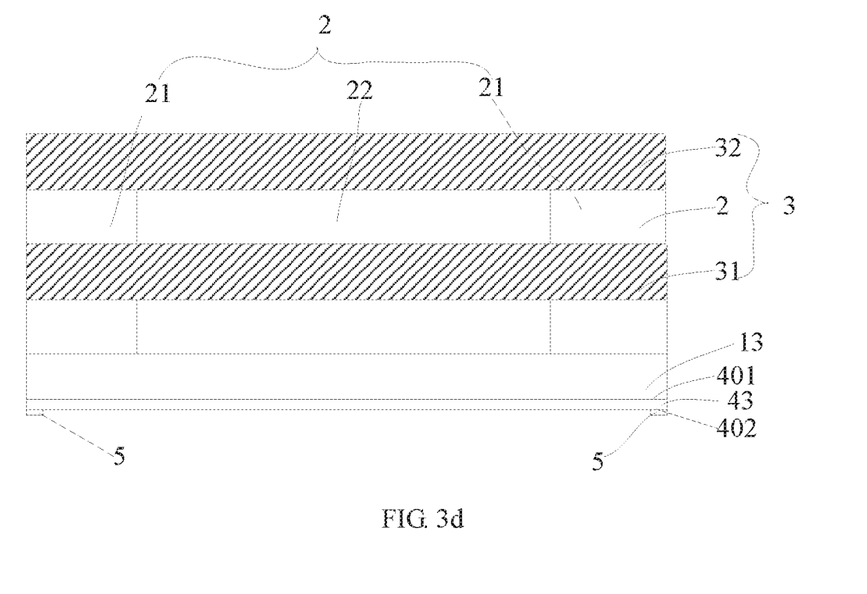
FIG. 3d is a schematic structural diagram of a flexible display module according to another embodiment of the present application.

FIG. 3a is a schematic structural diagram of a flexible display module according to another embodiment of the present application. FIG. 3b is a schematic structural diagram of a flexible display module according to another embodiment of the present application. FIG. 3c is a schematic structural diagram of a flexible display module according to another embodiment of the present application. FIG. 3d is a schematic structural diagram of a flexible display module according to another embodiment of the present application.

Referring to FIGS. 3a-3b, a first module material layer 1 may be an OLED flexible display screen body 13 having a multi-layer structure superposed by a Thin Film Encapsulation (TFE) layer, an OLED, a thin film transistor (TFT), a flexible Polyimide substrate (PI substrate), and the like. Therefore, a strain isolation layer 2 may also be disposed between various layers of the first module material layer 1. The structure of the first module material layer 1 and whether the strain isolation layer 2 is disposed between various layers of the first module material layer 1 are not limited in embodiments of the present application. However, the first module material layer 1 may also be other flexible display screen bodies, which is not specifically limited in embodiments of the present application.

Referring to FIGS. 3a-3b, a second module material layer 3 may be a polarizer layer 32 and may also be a touch layer 31. However, it should be understood that a type and a number of layers included in the second module material layer 3 are not limited in the embodiments of the present application. In the embodiments of the present application, when the flexible display module is bent, since the flexible display module is disposed with the strain isolation layer 2, wrinkle or delamination or fracture of film layers between the polarizer layer 32 and the first module material layer 1 is effectively prevented, or wrinkle or delamination or fracture of the film layers between the touch layer 31 and the first module material layer 1 is effectively prevented, and display failure is prevented.

Referring to FIG. 3c, in an embodiment, a second module material layer 3 may also include a polarizer layer 32 and a touch layer 31, and a strain isolation layer 2 is also disposed between the polarizer layer 32 and the touch layer 31, so that wrinkle or delamination or fracture between the polarizer layer 32 and the touch layer 31 may be effectively prevented by the strain isolation layer 2 when the flexible display module is bent and deformed.

Referring to FIG. 3d, in an embodiment, a PI substrate, a TFT, an OLED and a TFE of a flexible display screen body 13 are sequentially superposed on a first surface 401 of a third flexible glass substrate 43. The flexible display module further includes a trace region 5 disposed on a second surface 402 of the third flexible glass substrate 43, and the first surface 401 is a surface opposite to the second surface 402, and the trace region 5 is electrically connected to the flexible display screen body 13 on the first surface 401.

Furthermore, in an actual application scenario, the flexible display module may also need to be electrically connected to external circuit structure by a conductive lead wire. A hole may be punched on a surface (any one of a side surface, an upper surface and a bottom surface) of the third flexible glass substrate 43, and then a conductive material is filled in the hole to form the conductive lead wire electrically connected to the flexible display screen body 13, and a gap between the conductive material in the hole and the hole may be sealed with a sealing material. However, it should be understood that the flexible display module may also be electrically connected to the external circuit structure in other ways, but a specific structure and a formed manner of the conductive lead wire are not limited in embodiments of the present application.

In the embodiment, the first surface 401 of the third flexible glass substrate 43 is corresponding to a front surface an apparatus, and functional layers, which are disposed on the third flexible glass substrate 43, such as the TFT, the OLED, the TFE and the like together constitute a display region of the flexible display module. The second surface of the third flexible glass substrate 43 is a back surface, and the trace region 5 as a non-display portion is disposed at a corresponding position, such as a peripheral edge region, on the back surface of the third flexible glass substrate 43, and area of a non-display region in a front surface of an apparatus is greatly reduced, so that the apparatus may achieve a narrow bezel display or even a full screen display.

In the flexible display screen body 13 according to the embodiment, the trace region 5 of the non-display portion is disposed on the back surface of the third flexible glass substrate 43, so that the flexible display screen body 13 is electrically connected to a front surface of the OLED through the trace region 5, and the area of the non-display region of the flexible display screen body 13 is greatly reduced, which can cause that the flexible display screen body 13 achieves a narrow bezel display or even a full screen display, thereby a display effect of the flexible display screen body 13 is enhanced, and visual experience of users is improved.

In an embodiment of the present application, the third flexible glass substrate 43 includes a via hole, and a circuit trace of the trace region 5 may be connected to the flexible display screen body 13 located in a front surface through the via hole on the third flexible glass substrate 43. Specifically, structure of the via hole may be disposed in one-to-one correspondence with the circuit trace, and one via hole may also be disposed in correspondence with a plurality of circuit traces, or one via hole may be disposed in correspondence with all circuit traces. As for formation of the via hole, it may be achieved by laser punching or by a chemical method, and a wall of the via hole may evaporate various conductive media such as copper. Thus, the circuit trace of the trace region 5 on a back surface of the third flexible glass substrate 43 may be electrically connected to the front surface of the flexible display screen body through the via hole.

Figure 4:
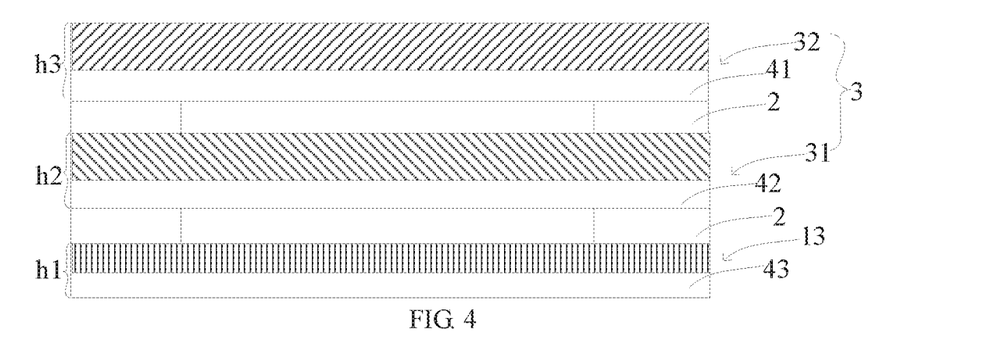
FIG. 4 is a schematic structural diagram of a flexible display module according to another embodiment of the present application.

FIG. 4 is a schematic structural diagram of a flexible display module according to another embodiment of the present application.

As shown in FIG. 4, the flexible display module may include a flexible display screen body 13, a touch layer 31 and a polarizer layer 32 that are superposed one on another. A strain isolation layer 2 is disposed between the flexible display screen body 13 and the touch layer 31; and the strain isolation layer 2 is disposed between the touch layer 31 and the polarizer layer 32. A bottom surface of the flexible display screen body 13 includes a third flexible glass substrate 43, a bottom surface of the touch layer 31 includes a second flexible glass substrate 42, and a bottom surface of the polarizer layer 32 includes a first flexible glass substrate 41.

However, it should be understood that the strain isolation layer 2 may be disposed only between the flexible display screen body 13 and the touch layer 31, or only between the touch layer 31 and the polarizer layer 32, and a specific position in which the strain isolation layer 2 is disposed is not limited in the embodiments of the present application.

In an embodiment, the second flexible glass substrate 42 may be disposed on the bottom surface of the touch layer 31. However, it should be understood that the second flexible glass substrate 42 may also be disposed on a top surface of the touch layer 31. Whether the second flexible glass substrate 42 included in the touch layer 31 is specifically disposed on the bottom surface or the top surface of the touch layer 31 is not specifically limited in the embodiment of the present application. Similarly, in the embodiment of the present application, the first flexible glass substrate 41 is disposed on the bottom surface of the polarizer layer 32, but the first flexible glass substrate 41 may also be disposed on the top surface of the polarizer layer 32. Whether the first flexible glass substrate 41 is disposed on the bottom surface of the polarizer layer 32 or on the top surface of the polarizer layer 32 is not specifically limited in the embodiments of the present application.

In an embodiment of the present application, when a final display product to be prepared needs to have a shape of a preset curved surface (for example, a 2.5D curved surface that the middle is a flat surface and a periphery is a curved surface, or a 3D curved surface that the middle and the periphery are all the curved surface), a frame having the shape of the preset curved surface may be prepared firstly, and then the flexible display module provided by the embodiment of the present application is mounted into the frame. The perimeter of the frame may be smaller than the perimeter of the flexible display module. The flexible display module itself has bendable performance, and when the flexible display module is mounted in a frame having the perimeter smaller than the perimeter of the flexible display module, the flexible display module is curved into the curved surface from the plane surface.

Figure 5:
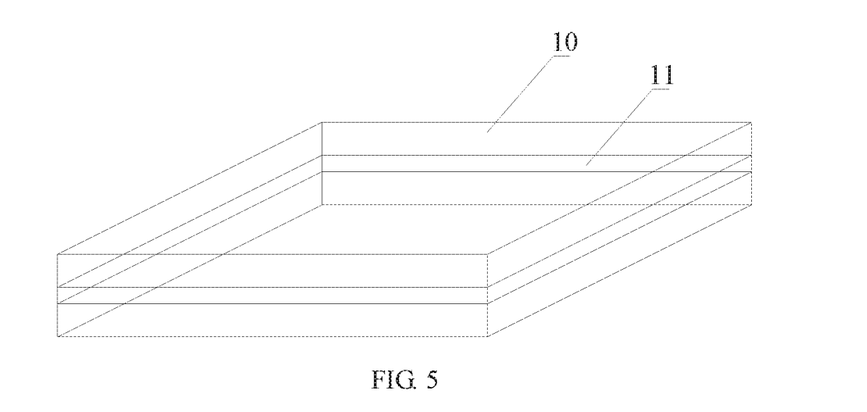
FIG. 5 is schematic structural diagram of a frame into which a flexible display module being mounted according to an embodiment of the present application.

In an embodiment, a method for the flexible display module being mounted into the frame may include that the frame is bonded to a periphery of entirety of the flexible display module in a frame-bonding manner. In order to ensure the flexible display module more securely mounted, an annular concave groove 11 may be disposed on an inner surface of the frame 10, as shown in FIG. 5.

A depth of the annular concave groove is preferably 3-5 mm, which ensures that the flexible display module is mounted into the frame securely and the frame is not too thick. A width of the annular concave groove may be equal to a thickness of the flexible display module.

A cross-sectional shape of the concave annular groove may be any one of a U-shaped, an arc and a trapezoidal.

Referring to the flexible display module, shown in FIG. 4, according to the embodiment of the present application, it is assumed that a thickness of the flexible display screen body 13 is h1, a thickness of the polarizer layer 32 is h2 and a thickness of the touch layer 31 is h3, r is a curvature radius of the flexible display module when the flexible display module is bent.

If the strain isolation layer 2 is not disposed between the flexible display screen body 13 and the polarizer layer 32 and between the polarizer layer 32 and the touch layer 31, and if difference in an elastic modulus is not considered, when the flexible display module is bent, a shape variable generated is:

$$\varepsilon\ \text{max}\ 1 \approx (h1+h2+h3)/2r;$$

If the strain isolation layer 2 is disposed between the flexible display screen body 13 and the polarizer layer 32 and between the polarizer layer 32 and the touch layer 31, when the flexible display module is bent, the shape variable generated is:

$$\varepsilon \text{ max } 2 \approx a \text{ maximum value of } h1/2r, h2/2r, h3/2r.$$

Obviously, ε max 1>>ε max 2, i.e., ε max 1 is much bigger than ε max 2, thus the flexible display module according to the embodiment of the present application may effectively reduce a strain between the flexible display screen body 13, the polarizer layer 32 and the touch layer 31 when the flexible display module is bent and deformed.

Figure 6:
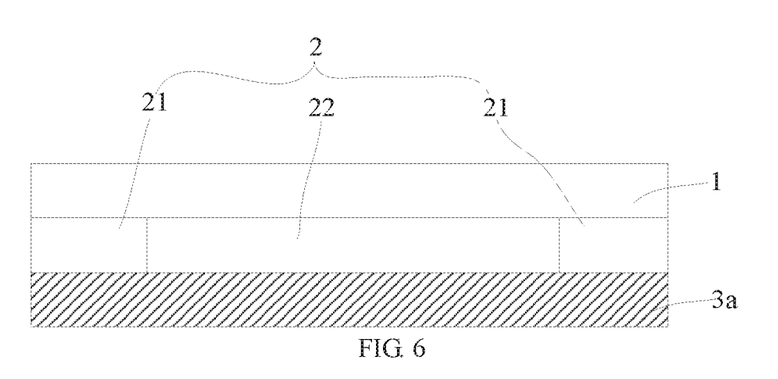
FIG. 6 is a schematic structural diagram of a flexible display module according to another embodiment of the present application.

FIG. 6 is a schematic structural diagram of a flexible display module according to another embodiment of the present application.

Referring to FIG. 6, the flexible display module according to the embodiment of the present application may further include a third module material layer 3a disposed below a first module material layer 1. A strain isolation layer 2 is disposed between the first module material layer 1 and the third module material layer 3a.

In an embodiment, the third module material layer 3a disposed below the first module material layer 1 may be any one or any combination of support films layer and buffer layers. However, it should be understood that which layers are specifically included in the third module material layer 3a is not limited in the embodiments of the present application. When the flexible display module is bent and deformed, wrinkle or delamination or fracture of film layers between the third module material layer 3a and the first module material layer 1 may be effectively prevented by the strain isolation layer 2.

Figure 7:
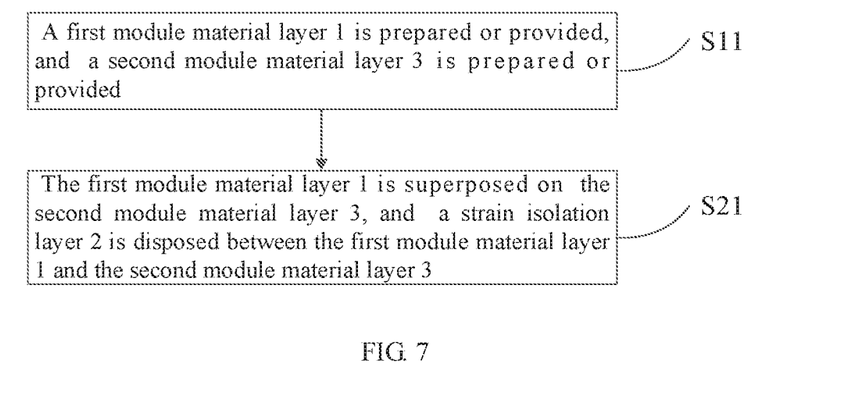
FIG. 7 is a schematic flowchart of a method of preparing a flexible display module according to an embodiment of the present application.

FIG. 7 is a schematic flowchart of a method of preparing a flexible display module according to an embodiment of the present application. As shown in FIG. 7, a method of the flexible display module includes the following steps.

S11: a first module material layer 1 is prepared or provided, and a second module material layer 3 is prepared or provided. The first module material layer 1 and the second module material layer 3 may be individually prepared, so that efficiency of preparation and yield of the first module material layer 1 and the second module material layer 3 may be improved.

In an embodiment, step S11 may further include that a third module material layer 3a is prepared or provided. However, how many layers of module material layers are specifically prepared is not limited the embodiments of the present application.

S21: the first module material layer 1 is superposed on the second module material layer 3, and a strain isolation layer 2 is disposed between the first module material layer 1 and the second module material layer 3. The strain isolation layer 2 includes a chamber 22 and an elastic material layer 21 surrounding an outer periphery of the chamber 22. By configuring the strain isolation layer 2, a strain of the first module material layer 1 and the second module material layer 3 may be effectively isolated.

Since the first module material layer 1 and the second module material layer 3 are prepared synchronously, the first module material layer 1 and the second module material layer 3 are prepared respectively and then are the first module material layer 1 and the second module material layer 3 superposed, so that preparation time of preparing the flexible display module may be saved. At the same time, a good rate of the flexible display module may also be increased.

In an embodiment, step S21 may further include: the third module material layer 3a are superposed below the first module material layer 1. A strain isolation layer 2 is disposed between the first module material layer 1 and the second module material layer 3 or between the first module material layer 1 and the third module material layer 3a, or the strain isolation layers 2 are disposed between the first module material layer 1 and the second module material layer 3 and between the first module material layer 1 and the third module material layer 3a. However, the strain isolation layer 2 disposed between which adjacent module material layers is not limited in the embodiments of the present application.

In an embodiment, step S11 may include: a first module material layer 1 including a first flexible glass substrate 41 disposed on a bottom surface 101 or a top surface 102 of the first module material layer 1, and a second module material layer 3 including the second flexible glass substrate 42 disposed on a bottom surface 301 or a top surface 302 of the second module material layer 3, are prepared or provided separately.

The first module material layer 1 may be an OLED flexible display screen body 13 having multi-layer structure formed by sequentially superposing devices such as a TFE, an OLED, a TFT, a flexible PI substrate, a third flexible glass substrate 43 and the like. The second module material layer 3 may include a polarizer layer 32, or may include a touch layer 31, or may include the touch layer 31 and the polarizer layer 32, which is not specifically limited in the embodiments of the present application. The polarizer layer 32 may include a first flexible glass substrate 41, and the touch layer 31 may also include a second flexible glass substrate 42. By disposing the second flexible glass substrate 41 and the second flexible glass substrate 42, fabrication of the polarizer layer 32 and the touch layer 31 is greatly facilitated. By disposing the third flexible glass substrate 43, the first flexible glass substrate 41 and the second flexible glass substrate 42, bendable performance of the flexible display screen body 13, the polarizer layer 32 and the touch layer 31 can be increased, stiffness of the flexible display module can also be increased, modular production of the flexible display module can be facilitated, and manufacture process performance of the flexible display module is optimized.

In an embodiment, superposed order of the polarizer layer 32, the touch layer 31 and the flexible display screen body 13 of the flexible display module may be from top to bottom: the polarizer layer 32, the touch layer 31 and the flexible display screen body 13, and order of three may also be from top to bottom: the touch layer 31, the polarizer layer 32 and the flexible display screen body 13 according to an actual requirement. However, it should be understood that arrangement order of the polarizer layer 32 and the touch layer 31 disposed on the flexible display screen body 13 is not specifically limited in the embodiments of the present application.

In an embodiment, a method for preparing the first modular material layer 1 may include: the third flexible glass substrate 43 is provided, and a flexible display screen body 13 is prepared on a first surface 401 of the third flexible glass substrate 43. For example, a PI substrate, a TFT, an OLED, and a TFE are sequentially prepared on the third flexible glass substrate 43. However, a method for preparing the flexible display screen body 13 is not specifically limited in the embodiments of the present application.

In an embodiment, the polarizer layer 32 may be prepared by coating a polarizer film on the first flexible glass substrate 41, and therefore, a method for preparing a second module material layer 3 may include: the first flexible glass substrate 41 is provided, and the polarizer layer 32 is prepared on the first flexible glass substrate 41. However, a specific preparation method of the polarizer layer 32 is not limited by the embodiments of the present application.

In an embodiment, the touch layer 31 may be prepared on the second flexible glass substrate 42 by a silver nanowire. However, a material of the touch layer 31 may also be other materials. A method for preparing a second module material layer 3 may include: the second flexible glass substrate 42 is provided, and the touch layer 31 is prepared on the second flexible glass substrate 42. A specific material of the touch layer 31 and a specific preparation method of the touch layer 31 are not limited in the embodiments of the present application.

In an embodiment, step S21 may include: the flexible display screen body 13, the touch layer 31 and the polarizer layer 32 being sequentially superposed. A strain isolation layer 2 is disposed between the flexible display screen body 13 and the touch layer 31, and a strain isolation layer 2 is disposed between the touch layer 31 and the polarizer layer 32. However, A strain isolation layer 2 may be disposed only between the flexible display screen body 13 and the touch layer 31, or only between the touch layer 31 and the polarizer layer 32, and a specific position at which the strain isolation layer 2 is disposed is not limited the embodiments of the present application. During a superposed process, the third flexible glass substrate 42 of the touch layer 31 may face to the flexible display screen body 13, or may also back to the flexible display screen body 13. Similarly, the second flexible glass substrate 41 of the polarizer layer 32 may be disposed above the flexible display screen body 13, and may also back to the flexible display screen body 13. Orientation of the third flexible glass substrate 42 of the touch layer 31 and orientation of the second flexible glass substrate 41 of the polarizer layer 32 are not specifically limited in the embodiments of the present application.

Figure 8:
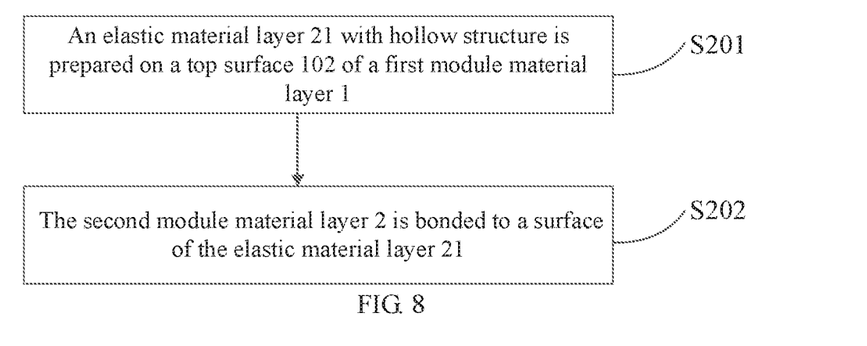
FIG. 8 is a schematic flowchart of a method of preparing a flexible display module according to another embodiment of the present application.

FIG. 8 is a schematic flowchart of a method of preparing a flexible display module according to an embodiment of the present application.

Referring to FIG. 8, step S21 may include the following steps.

S201: an elastic material layer 21 with hollow structure is prepared on a top surface 102 of a first module material layer 1. However, step S201 may also be that the elastic material layer 21 with the hollow structure is prepared on a bottom surface 301 of a second modular material layer 3, whether the elastic material layer 21 with the hollow structure being prepared on the top surface 102 of the first module material layer 1 or the bottom surface 301 of the second modular material layer 3 is not limited in the embodiments of the present application. Preparation of a strain isolation layer 2 may be preliminarily completed by step S201.

S202: the second module material layer 3 is bonded to a surface of the elastic material layer 21. Similarly, step S202 may also be that the first module material layer 1 is bonded on the surface of the elastic material layer 21, which is not specifically limited in the embodiments of the present application. By the above-described bond, the strain isolation layer 2 between the first module material layer 1 and the second module material layer 3 may be formed.

Determiners such as first, second and third and the like mentioned in embodiments of the present application are used solely to describe more clearly technical solutions of the embodiments of the present application and are not intended to limit protection scope of the present application.

The above are only preferred embodiments of the present application, which are not intended to limit the present application. Any modifications, equivalent substitutions and the like made within spirit and principle of the present application should be included within the protection scope of the present application.

What is claimed is:

1. A flexible display module, comprising:
 a plurality of overlapped module material layers that includes a flexible glass substrate, a touch layer, and a polarizer layer; and
 at least one strain isolation layer disposed between the touch layer and the polarizer layer of the plurality of module material layers,
 at least one strain isolation layer disposed between the polarizer layer and the flexible glass substrate of the plurality of module material layers,
 wherein each of the at least one strain isolation layers comprises a chamber and an elastic material layer surrounding an outer periphery of the chamber,
 wherein the strain isolation layers reduce a strain between the plurality of module material layers,
 wherein the elastic material layer has a first elastic modulus less than 10 kPa, and the flexible glass substrate has a second elastic modulus, and
 wherein the second elastic modulus is at least $10^6$ times higher than the first elastic modulus;
 wherein a top surface of the chamber is formed as a bottom surface of a second module material layer of two adjacent module material layers, and a bottom surface of the chamber is formed as a top surface of a first module material layer of the two adjacent module material layers and wherein the elastic modulus of the elastic material layer is less than that of the first module material layer and the second module material layer.

2. The flexible display module according to claim 1, wherein the plurality of the module material layers further comprise a flexible display screen body, wherein the plurality of the module material layers are overlapped one by one in sequence.

3. The flexible display module according to claim 1, wherein the chamber is in a vacuum state.

4. The flexible display module according to claim 2, wherein at least one of the module material layers comprises a flexible glass substrate, and the flexible display screen body is disposed on a first surface of the flexible glass substrate.

5. The flexible display module according to claim 4, wherein an elastic modulus of the flexible glass substrate is not lower than 80 GPa, and/or, a thickness of the flexible glass substrate is from 25 μm to 100 μm.

6. The flexible display module according to claim 4, further comprising:
 a trace region disposed on a second surface of the flexible glass substrate and electrically connected to the flexible display screen body, wherein the first surface of the flexible glass substrate and the second surface of the flexible glass substrate are opposite to each other.

7. The flexible display module according to claim 6, wherein the flexible glass substrate comprises a via hole, and a circuit trace in the trace region electrically connects the flexible display screen body to an external circuit via the via hole.

8. The flexible display module according to claim 1, wherein an elastic modulus of the elastic material layer is lower than that of the two adjacent module material layers.

9. A flexible display device, comprising:
a flexible display module according to claim 1; and
a frame having a preset curved surface shape,
wherein the flexible display module is disposed in the frame, and the length of the inner periphery of the frame is less than the length of the outer periphery of the flexible display module.

10. The flexible display device according to claim 9, wherein a surface of the inner periphery of the frame comprises an annular concave groove, and the frame is bonded to the outer periphery of the flexible display module in a frame-bonding manner.

11. The flexible display device according to claim 10, wherein a depth of the annular concave groove is from 3 to 5 mm.

12. The flexible display device according to claim 10, wherein a cross-sectional shape of the annular concave groove is one of an arc, a trapezoidal shape and a U-shape.

13. The flexible display module according to claim 1, wherein the chamber is filled with gas.

14. The flexible display module according to claim 1, wherein the chamber is filled with gas and silicone oil.

* * * * *